US010964466B2

(12) United States Patent
Song et al.

(10) Patent No.: US 10,964,466 B2
(45) Date of Patent: Mar. 30, 2021

(54) INSULATION TREATMENT METHOD FOR HELIUM INLET PIPE OF SUPERCONDUCTING MAGNET

(71) Applicant: HEFEI INSTITUTES OF PHYSICAL SCIENCE, CHINESE ACADEMY OF SCIENCES, Anhui (CN)

(72) Inventors: Yuntao Song, Anhui (CN); Guang Shen, Anhui (CN); Kun Lu, Anhui (CN); Bing Hu, Anhui (CN); Xiaowu Yu, Anhui (CN); Jing Wei, Anhui (CN)

(73) Assignee: HEFEI INSTITUTES OF PHYSICAL SCIENCE, CHINESE ACADEMY OF SCIENCES, Hefei (CN)

( * ) Notice: Subject to any disclaimer, the term of this patent is extended or adjusted under 35 U.S.C. 154(b) by 0 days.

(21) Appl. No.: 17/033,986

(22) Filed: Sep. 28, 2020

(65) Prior Publication Data
US 2021/0012937 A1 Jan. 14, 2021

Related U.S. Application Data

(63) Continuation of application No. PCT/CN2019/105979, filed on Sep. 16, 2019.

(30) Foreign Application Priority Data

Dec. 25, 2018 (CN) .......................... 201811593003.5

(51) Int. Cl.
*H01F 6/04* (2006.01)
*F16L 59/02* (2006.01)
(Continued)

(52) U.S. Cl.
CPC ................ *H01F 6/04* (2013.01); *C21D 8/10* (2013.01); *C21D 9/08* (2013.01); *C22C 38/00* (2013.01);
(Continued)

(58) Field of Classification Search
CPC ... H01F 6/04; H01F 6/00; C22C 38/06; C22C 38/001; C22C 38/28; C22C 38/32;
(Continued)

(56) References Cited

U.S. PATENT DOCUMENTS 5,680,085 A * 10/1997 Aihara .................... H01L 39/20
335/216
5,697,220 A * 12/1997 Pierce .................. F25B 25/005
62/45.1

FOREIGN PATENT DOCUMENTS

CN 102709019 A 10/2012
CN 104200951 A 12/2014
(Continued)

OTHER PUBLICATIONS

Fatigue Tests on ITER PF6 Coil Helium Inlet at 77K; IEEE Transactions on Applied Superconductivity, vol. 28, No. 5, Aug. 2018.
(Continued)

*Primary Examiner* — Mohamad A Musleh

(57) ABSTRACT

Disclosed is an insulation treatment method for a helium inlet pipe of a superconducting magnet. The superconducting magnet has a structure with varying T-shaped cross section. The irregular parts of the magnet are filled with G10 to reduce the difficulty in the insulation treatment caused by the irregular shape. Moreover, a skirt-shaped insulating material is provided around the metal conduit to overcome the reduction in the insulation electrical performance caused by the defects in the insulation treatment for such irregular parts. The application designs a sample structure for insulation treatment, and can wrap the superconducting magnet having the T-shaped varying cross-section with insulating materials before vacuum pressure impregnation, meeting special requirements of high-voltage insulation treatment for
(Continued)

the superconducting magnet with a complex structure under low temperature and vacuum environment.

2 Claims, 1 Drawing Sheet

(51) Int. Cl.
*H01F 6/00* (2006.01)
*C22C 38/00* (2006.01)
*C22C 38/32* (2006.01)
*C21D 9/08* (2006.01)
*C21D 8/10* (2006.01)
*C22C 38/28* (2006.01)
*C22C 38/06* (2006.01)
*G01R 33/3815* (2006.01)
*G01R 33/38* (2006.01)

(52) U.S. Cl.
CPC ............ *C22C 38/001* (2013.01); *C22C 38/06* (2013.01); *C22C 38/28* (2013.01); *C22C 38/32* (2013.01); *F16L 59/027* (2013.01); *H01F 6/00* (2013.01); *F16L 59/029* (2013.01); *G01R 33/3804* (2013.01); *G01R 33/3815* (2013.01)

(58) Field of Classification Search
CPC .. C22C 38/00; C21D 8/10; C21D 9/08; F16L 59/027; F16L 59/029; G01R 33/3804; G01R 33/3815
See application file for complete search history.

(56) References Cited

FOREIGN PATENT DOCUMENTS

| | | | |
|---|---|---|---|
| CN | 107103958 A | | 8/2017 |
| CN | 108318795 A | | 7/2018 |
| CN | 109712772 A | | 5/2019 |
| FR | 1564935 A | * | 4/1969 ............. H01F 6/065 |

OTHER PUBLICATIONS

Study on Mechanical Analysis of CFETR CS Model Coil and the Design and Manufacturing Technology of Helium Inlet and Outlet; China Doctoral Dissertations Full-Text Database).No. 9, Sep. 15, 2018 (Sep. 15, 2018).p. 6, paragraphs 2-3, p. 9, paragraph 4 to p. 10, last paragrap and p. 37.paragraphs 2-4, and figures 1.11, 2.14 and 3.2.

* cited by examiner

INSULATION TREATMENT METHOD FOR HELIUM INLET PIPE OF SUPERCONDUCTING MAGNET

CROSS-REFERENCE TO RELATED APPLICATIONS

This application is a continuation of International Patent Application No. PCT/CN2019/105979, filed on Sep. 16, 2019, which claims the benefit of priority from Chinese Patent Application No. 201811593003.5, filed on Dec. 25, 2018. The content of the aforementioned applications, including any intervening amendments thereto, is incorporated herein by reference.

TECHNICAL FIELD

The present application relates to insulation treatment for a superconductor in a nuclear fusion device, and more particularly to an insulation treatment method for a helium inlet pipe of a superconducting magnet.

BACKGROUND

Thermonuclear fusion, as one of ultimate energy solutions, will provide humans with inexhaustible clean energy. In the international thermonuclear experimental reactor (ITER) under construction, a superconducting magnet, as one of the most crucial components, is generally exposed to a very harsh working environment such as complex mechanical and electromagnetic conditions and thermal stress loads, so there are relatively high requirements for the electrical insulation properties of the magnet. During the insulation treatment of the magnet, the insulation treatment for the irregular parts of the magnet plays a crucial role in affecting the insulation performance of the magnet. Among such parts, the helium inlet pipe of the superconducting magnet for cooling, due to the high irregularity in shape, is required to be designed into a special insulation structure before the vacuum pressure impregnation with insulating resin, ensuring the magnet to have satisfactory insulation properties after the vacuum pressure impregnation.

SUMMARY

An object of this application is to provide an insulation treatment method for a helium inlet pipe of a superconducting magnet to ensure the superconducting magnet to have satisfactory insulation properties at the irregular parts after the vacuum pressure impregnation with a resin, which is of great engineering significance for the insulation treatment of a magnet with an irregular shape.

The technical solutions of this application are described as follows.

The application provides an insulation treatment method for a helium inlet pipe of a superconducting magnet, comprising:

welding an end of a metal conduit to an outer surface of a superconducting conductor;

wrapping an outer surface of the metal conduit with a composite insulating tape;

covering the outer surface of the superconducting conductor with fiberglass cloth;

filling spaces around a junction between the metal conduit and the superconducting conductor with G10, and fixing the G10 to the metal conduit and the superconducting conductor with a binding tape;

covering the G10 with a skirt-shaped insulating material with the metal conduit as a center; and fixing the skirt-shaped insulating material to the metal conduit and the superconducting conductor with the binding tape;

wherein the binding tape is made of a composite insulating material.

In some embodiments, the composite insulating tape, the binding tape and the skirt-shaped insulating material are all made of a composite material of the fiberglass cloth and a polyimide film; and the G10 is a composite material composed of fiberglass and epoxy resin.

This application has the following beneficial effects.

In the application, the irregular parts of the magnet are filled with G10 to reduce the difficulty in the insulation treatment caused by the irregularity. Moreover, a skirt-shaped insulating material is provided around the metal conduit to alleviate the decrease in the insulation electrical performance caused by the defects in the insulation treatment due to the irregular shape.

Figure 1:
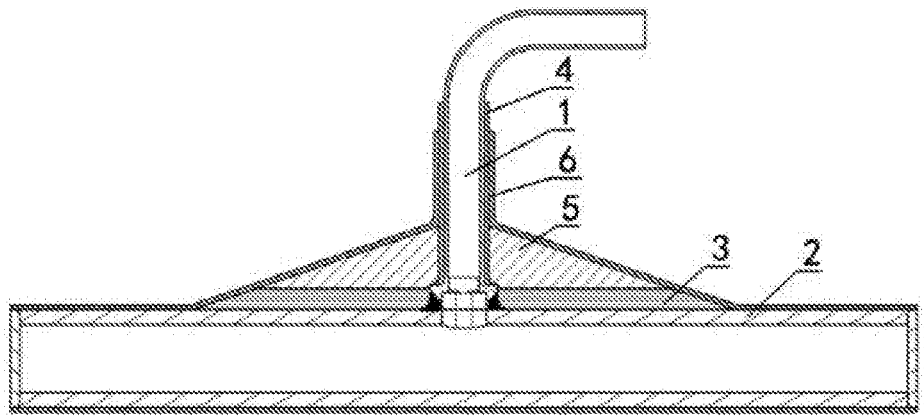
FIG. 1 shows the structure designed in an insulation treatment method for a helium inlet pipe of a superconducting magnet according to the present application.

In the drawings: 1, metal conduit; 2, superconducting conductor; 3, fiberglass cloth; 4, composite insulating tapes; 5, G10; 6, binding tapes; and 7, skirt-shaped insulating material.

DETAILED DESCRIPTION OF EMBODIMENTS

Figure 2:
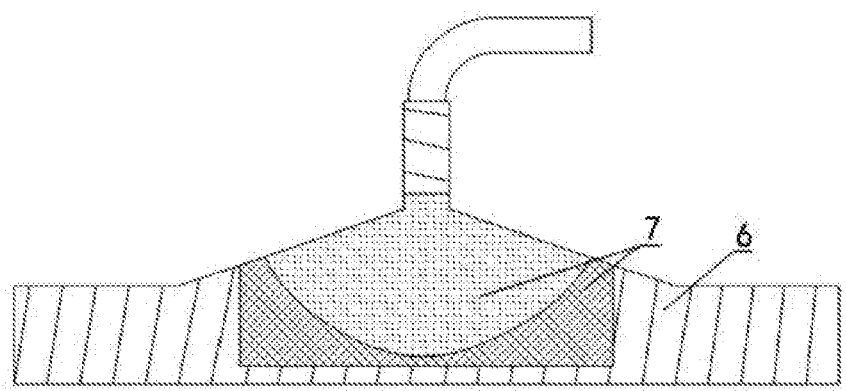
FIG. 2 shows the fitting of a skirt-shaped insulating material according to the present application.

This application provided an insulation treatment method for a helium inlet pipe of a superconducting magnet, and a structure involved therein was shown in FIGS. 1 and 2. The method was specifically implemented as follows.

1) A metal conduit 1 is welded to a superconducting conductor 2.

2) Fiberglass cloth 3 is attached to a surface of the superconducting conductor 2.

3) The metal conduit 1 is wrapped with a composite insulating tape 4.

4) Spaces around a junction between the metal conduit 1 and the superconducting conductor 2 are filled with G10 5.

5) The G10 5 is fixed by winding with a binding tape 6.

6) The G10 5 around the metal conduit 1 is covered with a skirt-shaped insulating material 7, which is fixed by winding with the binding tape 6.

7) Step (6) is repeated to obtain the desired dielectric strength.

8) The part obtained in step (7) is subjected to insulation curing through vacuum pressure impregnation.

9) A dielectric withstand voltage test is performed on the part.

The composite insulating tape 4, the binding tape 6 and the skirt-shaped insulating material 7 are all made of a composite material of the fiberglass cloth and a polyimide film; and the G10 is composed of fiberglass and epoxy resin.

What is claimed is:

1. An insulation treatment method for a helium inlet pipe of a superconducting magnet, comprising:

welding an end of a metal conduit to an outer surface of a superconducting conductor;

wrapping an outer surface of the metal conduit with a composite insulating tape;

covering the outer surface of the superconducting conductor with fiberglass cloth;

filling spaces around a junction between the metal conduit and the superconducting conductor with G10, and fixing the G10 to the metal conduit and the superconducting conductor with a binding tape;

covering the G10 with a skirt-shaped insulating material with the metal conduit as a center; and fixing the skirt-shaped insulating material to the metal conduit and the superconducting conductor with the binding tape;

wherein the binding tape is made of a composite insulating material.

2. The insulation treatment method of claim 1, wherein the composite insulating tape, the binding tape and the skirt-shaped insulating material are all made of a composite material of the fiberglass cloth and a polyimide film; and the G10 is a composite material composed of fiberglass and epoxy resin.

* * * * *